(12) United States Patent
Boutonne et al.

(10) Patent No.: US 7,982,855 B2
(45) Date of Patent: Jul. 19, 2011

(54) ILLUMINATOR FOR A PHOTOLITHOGRAPHY DEVICE

(76) Inventors: Miguel Boutonne, Paris (FR); Renaud Mercier Ythier, Paris (FR); François Riguet, Paris (FR)

( * ) Notice: Subject to any disclaimer, the term of this patent is extended or adjusted under 35 U.S.C. 154(b) by 521 days.

(21) Appl. No.: 11/991,497

(22) PCT Filed: Sep. 5, 2006

(86) PCT No.: PCT/EP2006/066032
§ 371 (c)(1),
(2), (4) Date: Mar. 5, 2008

(87) PCT Pub. No.: WO2007/028793
PCT Pub. Date: Mar. 15, 2007

(65) Prior Publication Data
US 2009/0257041 A1    Oct. 15, 2009

(30) Foreign Application Priority Data

Sep. 5, 2005  (FR) .................................. 05 09036

(51) Int. Cl.
*G03B 27/72* (2006.01)
(52) U.S. Cl. ........................................................ 355/71
(58) Field of Classification Search ............... 355/53, 355/67, 71
See application file for complete search history.

(56) References Cited

U.S. PATENT DOCUMENTS

| | | |
|---|---|---|
| 4,497,015 A | 1/1985 | Konno et al. |
| 4,916,322 A | 4/1990 | Glavish et al. |
| 5,130,213 A | 7/1992 | Berger et al. |
| 5,709,970 A | 1/1998 | Hashimoto et al. |

(Continued)

FOREIGN PATENT DOCUMENTS

JP        62-47124        2/1987

(Continued)

OTHER PUBLICATIONS

English Translation of JP 62-047124, published Feb. 28, 1987.*

(Continued)

*Primary Examiner* — Edward J Glick
*Assistant Examiner* — Deoram Persaud
(74) *Attorney, Agent, or Firm* — Harness, Dickey & Pierce, P.L.C.

(57) ABSTRACT

The invention relates to an illuminator for a photolithography device. The invention comprises: a source (1') of a light beam (10) which is used to illuminate a mask (8) and to expose an area of a wafer (W); at least one main array (4) of microlenses; and a shutter (6) consisting of at least one shutter plate (61) comprising at least one part (612) that is opaque to the light beam (10) and a plurality of parts (610) that are transparent to the beam, whereby said plate (61) can be moved in relation to the beam (10) along a direction of movement (X) that is essentially parallel to the plate, such that the opaque part (612) can at least partially block the light beam or such that the transparent parts can at least partially enable the passage of the light beam (10). The invention is characterized in that it comprises movement means (9) which can move the shutter (6) in synchronism with the movements of the mask (8) and the wafer (W), said shutter (6) being located in an area (11) close to a pupil (40, 410) of an optical system comprising at least the main array (4) of microlenses. The invention also relates to a photolithography device comprising one such illuminator.

22 Claims, 8 Drawing Sheets

U.S. PATENT DOCUMENTS

| | | | | |
|---|---|---|---|---|
| 5,854,671 | A | * 12/1998 | Nishi | 355/53 |
| 5,991,009 | A | 11/1999 | Nishi et al. | |
| 6,219,171 | B1 | 4/2001 | Liao et al. | |
| 6,556,361 | B1 * | 4/2003 | Smith et al. | 359/738 |
| 6,930,754 | B1 * | 8/2005 | Sugita et al. | 355/53 |
| 2002/0050576 | A1 * | 5/2002 | Nishi et al. | 250/548 |
| 2002/0177048 | A1 * | 11/2002 | Saitoh et al. | 430/5 |
| 2003/0170552 | A1 | 9/2003 | Miyashita et al. | |

FOREIGN PATENT DOCUMENTS

| | | |
|---|---|---|
| JP | 01-175730 | 7/1989 |
| JP | 07-120850 | 5/1995 |

OTHER PUBLICATIONS

French Preliminary Search Report for French Application No. FR 0509036, dated Jun. 12, 2006 (2 pages) (in French language).

* cited by examiner

FIG_11

FIG_12

FIG_13

FIG_14

ILLUMINATOR FOR A PHOTOLITHOGRAPHY DEVICE

GENERAL TECHNICAL FIELD

The present invention relates to an illuminator for a photolithography device, as well as such a device.

PRIOR ART

Photolithography, also called "microlithography", has been used for many years to produce semiconductor devices, and, for this purpose, uses electromagnetic radiation to generate fine patterns on semiconductor devices. To this end, an illuminator for a photolithography device illuminates a mask, of which the image is projected onto a semiconductor wafer, which provides a circuit after an ad hoc treatment known to a person skilled in the art.

Figure 1:
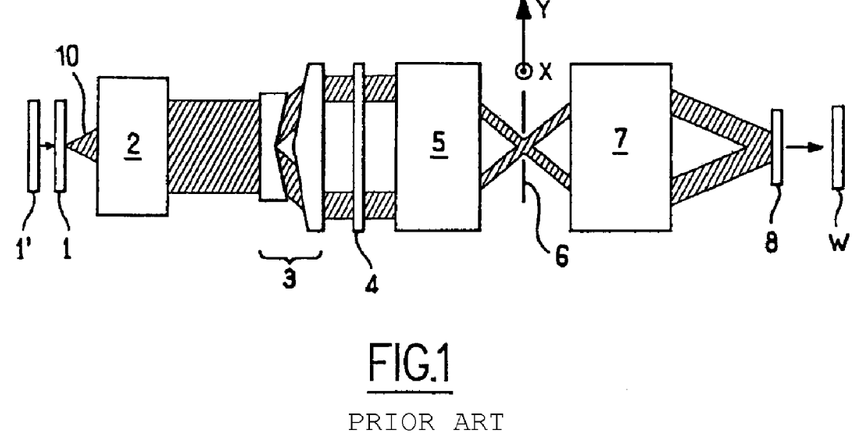
FIG. 1, mentioned above, diagrammatically shows an illuminator known from the prior art.

As shown in FIG. 1, the illumination system, which will be referred to as an "illuminator" in the remainder of the description, for a photolithography device is complex. It must take into account a plurality of parameters simultaneously in order to satisfy the microlithography requirements. The parameters concerned are in particular:

the illumination profile in the pupil of the device;
the uniformity of illumination on the mask (and therefore the wafer); and
the illumination profile on the mask.

To this end, a known illuminator generally comprises a diffractive optical element 1 (DOE), which is illuminated by an illumination source 1'. The element 1 can be any element generally used to produce diffraction, such as, for example, a two-dimensional array of spherical microlenses, a Fresnel lens, a diffraction grating, etc. The element 1 acts as an optical diffuser and is intended primarily to produce, at its output, a pupil with a general desired pattern, for example a disk or ring-shaped pattern, or a dipolar or quadripolar pattern. The element 1 is interchangeable, because an element 1 of a given type can generate only a single pattern at a time.

The illuminator comprises, at the output of the element 1, a zoom 2 formed by a plurality of lenses. The function of the zoom 2 is to bring the image of the pupil to a finite distance and to be capable of causing it to vary in dimension.

The output of the zoom 2 is directed toward axicons 3 that give its definitive shape to the pupil. For example, in the case of axicons comprised of conical lenses, it is possible to control the internal diameter of a ring-shaped pupil.

The assembly formed by the element 1, the zoom 2 and the axicons 3 therefore makes it possible to obtain a desired illumination profile in the pupil.

The light beam leaving the axicons 3 illuminates an optical element 4. The element is generally constituted by two matrices formed by a two-dimensional array of spherical microlenses, which cuts the pupil obtained at the output of the assembly of the element 1, the zoom 2 and the axicons 3. The pupil of the zoom 2 is located at the level of the element 4 of which the output illuminates a condenser 5.

The condenser 5 comprises a plurality of lenses that make it possible to superimpose the sub-beams coming from the diffractive element 4 at the level of the shutter 6.

The assembly of the element 4 and the condenser 5 standardizes the illumination in the plane of a shutter 6.

Indeed, the output of the condenser 5 illuminates a shutter 6 (also called a "slit"). The shutter 6 makes it possible in a known manner to block the light beam coming from the condenser 5.

The shutter 6 makes it possible to control the dose, the image format and the illumination profile on a mask 8 owing in particular to a group 7 of illumination lenses (or "Illumination Lens Group" (ILG)) placed at the output of the shutter 6.

Figure 2:
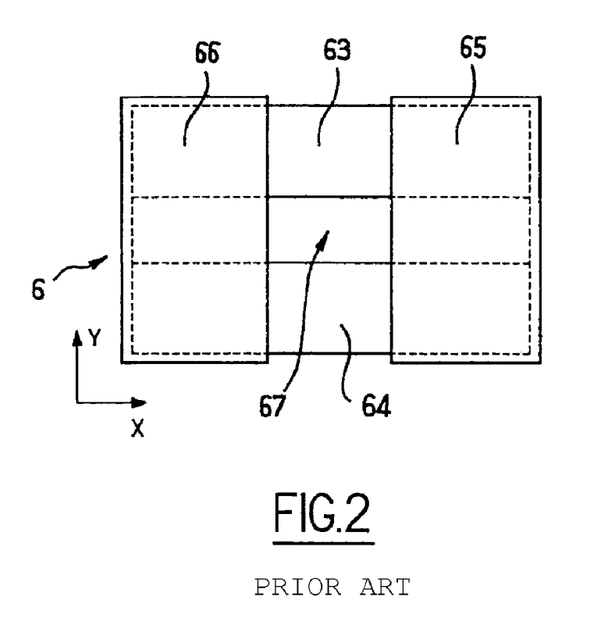
FIG. 2, also mentioned above, shows a shutter known from the prior art.

The shutter 6 comprises, as shown in FIG. 2, in particular two stationary plates 63 and 64. The plates 63 and 64 are rectangular, and their length extends substantially in direction X. The plates 63 and 64 are immobile with respect to the illumination, in particular with respect to directions X and Y of FIG. 2. The plates 63 and 64 are separated from one another in direction Y and define two edges of an area of exposure 67.

The shutter 6 also comprises two plates 65 and 66 that are mobile with respect to the illumination in direction X. The plates 65 and 66 are rectangular, and their length extends substantially in direction Y. When the plates 65 and 66 are separated from one another in direction X, they define two edges of area 67.

The space between plates 63, 64, 65 and 66 thus defines the area 67 of exposure to the illumination for the etching of the wafer.

FIGS. 3A to 3E show the operation of the shutter 6 of the prior art.

In the known movement of the mask 8 and the wafer W, one with respect to the other, for an exposure for the purpose of etching, it is not necessary for the points outside of the zone W1 of the wafer to be etched to receive the exposure energy. Thus, in particular the movement of the plates 65 and 66 is synchronized with the movements of the mask 8 and the wafer W.

Figure 3A:
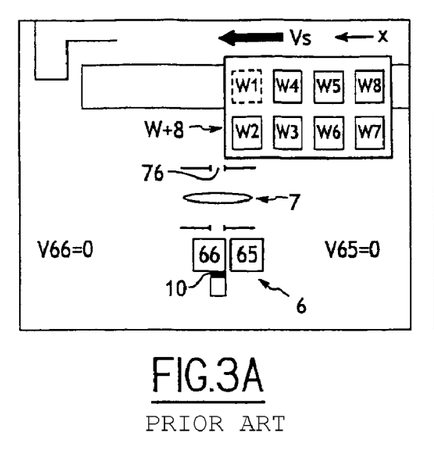
FIGS. 3A to 3E, mentioned above, diagrammatically show the various phases of movement of plates of the shutter according to FIG. 2 according to the movement of a mask placed in an illuminator according to FIG. 1.

In FIGS. 3A to 3E, it has been shown for greater clarify that the mask 8 was located on the wafer W. Of course, the mask is optically located to the right of the wafer W. FIG. 3A shows that when the wafer W and the mask are moved in direction X but are located outside of the exposure zone 76 defined by the relay 7, then the plates 66 and 65 are closed. The area 67 is a null and the beam 10 is blocked by the shutter 6.

Figure 3B:
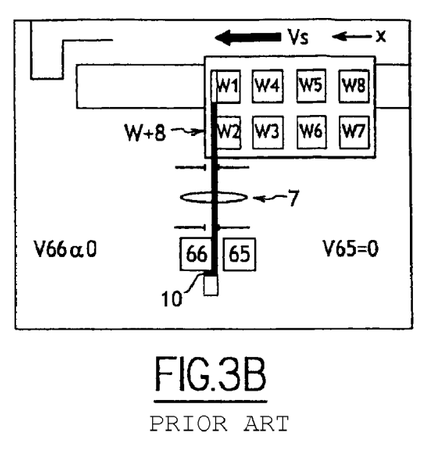

FIG. 3B shows that when the left edge of the mask 8 defining the first zone W1 of the wafer W to be exposed arrives at the level of the right edge of the plate 66, going beyond the right edge of the zone 76, then the plate 66 begins a movement in synchrony with and in the same direction as the mask 8 with a speed in synchrony with the speed Vs of the wafer W and the mask 8. In other words, the speed of the plate 66 is proportional to the speed Vs. The zones of the wafer W located outside of the zone W1 to be exposed thus are not exposed to the beam 10.

Figure 3C:
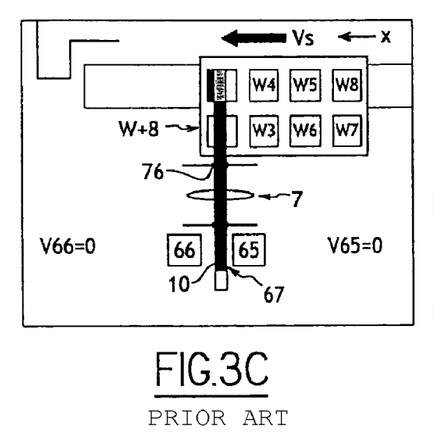

FIG. 3C shows that the plate 66 follows the mask 8 until the left edge of the mask 8 is located at the level of the left edge of the exposure zone 76. The area 67 is then maximal and the entire beam 10 exposes the zone W1 through the zone 76.

Figure 3D:
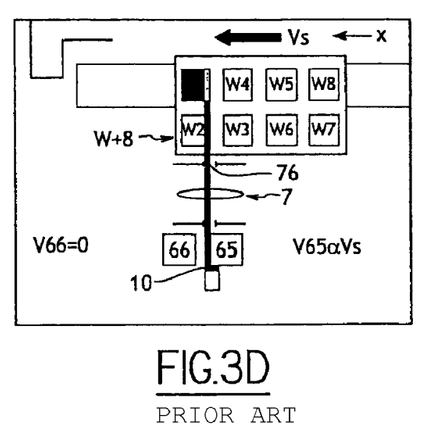

FIG. 3D shows that it is then the plate 65 that follows the mask 8 in the same direction as the mask 8 in direction X when the right edge of the mask goes beyond the right edge of the zone 76. Again, the movement of the plate 65 is in synchrony with the movements of the wafer W and the mask 8, namely in the same direction as and with a speed proportional to the speed Vs of the wafer W. In this way, the zones of the wafer W located outside of the zone W1 are not exposed to the beam 10.

Figure 3E:
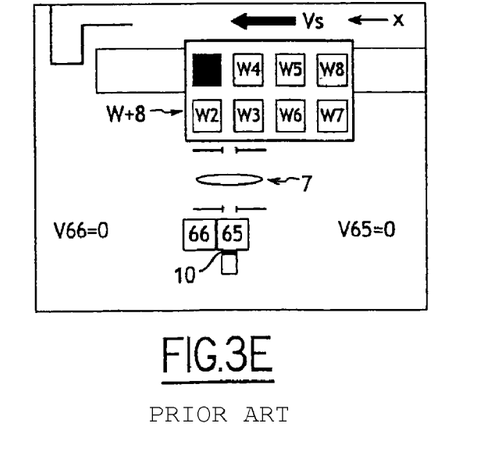

FIG. 3E corresponds to the closure of the exposure area 67, in which plates 65 and 66 are then joined. The zone W1 is outside of the zone 76 and the beam 10 is blocked by the shutter.

When the mask moves in the other direction according to X, for example, for an exposure of zones W2 to W8, the plates 65 and 66 of course move in the other direction. The closure can occur at a speed of around 160 mm/s.

With this method of opening and closing the plates 65 and 66, all of the points of the zone to be etched receive the same exposure energy and the zones that should not be exposed are not exposed.

Group 7 forms an optical relay that conjugates the plane of the shutter 6 and the mask 8. In fact, without group 7, the shutter 6 and the mask 8 should be located in the same plane, which is impossible from a mechanical perspective in the assembly of FIG. 1. There would in particular be friction of the plates 65 and 66 against the mask 8.

The illuminators of the prior art have disadvantages.

The illuminator according to the prior art is complicated and expensive to produce, in particular due to the presence of a group 7 forming an optical relay for conjugating the plane of the shutter and the mask. The complexity of such a group is both optical and mechanical.

In addition, the mechanical elements making it possible to move the mobile plates of the shutter are complex and expensive, due to the large amplitude of the course and the high speed of translation of the plates (around 160 mm/s).

DESCRIPTION OF THE INVENTION

The invention is intended to overcome at least one of these disadvantages.

To this end, the invention proposes an illuminator according to claim 1.

The invention is advantageously complemented with the features presented in the dependent claims.

The invention also relates to a device comprising such an illuminator.

The invention has numerous advantages.

First, an illuminator according to the invention is simpler and therefore less expensive, due to the absence of a group forming an optical relay in order to conjugate the plane of the shutter and the mask.

In addition, the mechanical elements enabling the movement of the mobile plates, one with respect to another, are also simpler and therefore less expensive, due to the reduction in amplitude of the course and the speed of translation of the plates. One may expect a reduction by a factor of 10 in the speed of movement of the plates of the shutter, which allows for a reduction in vibrations produced in the photolithography device as well as a simplification of the means for moving the shutter.

An illuminator according to the invention makes it possible in particular to correct certain defects of the illumination due to the nature of the illumination source, in particular when the source is a laser. An illuminator according to the invention makes it possible to obtain a trapezoidal illumination profile according to the direction of movement of the mask and the wafer.

An illuminator according to the invention also in particular allows for a clean cut of the illumination.

DESCRIPTION OF THE FIGURES

Other features, objectives and advantages of the invention will become clear from the following description, provided solely for illustrative and non-limiting purposes, which should be read in reference to the appended drawings, in which:

FIGS. 9A to 9F diagrammatically show a possible mode of operation of an alternative according to FIG. 8;

In all of the figures, similar elements have the same numeric references.

DETAILED DESCRIPTION

Figure 4A:
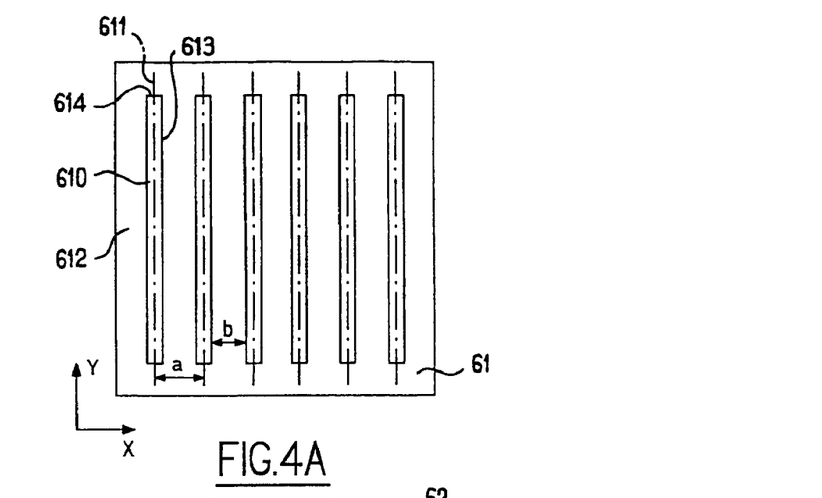
FIGS. 4A and 4B each diagrammatically show a plate of a shutter according to the invention.
Figure 6:
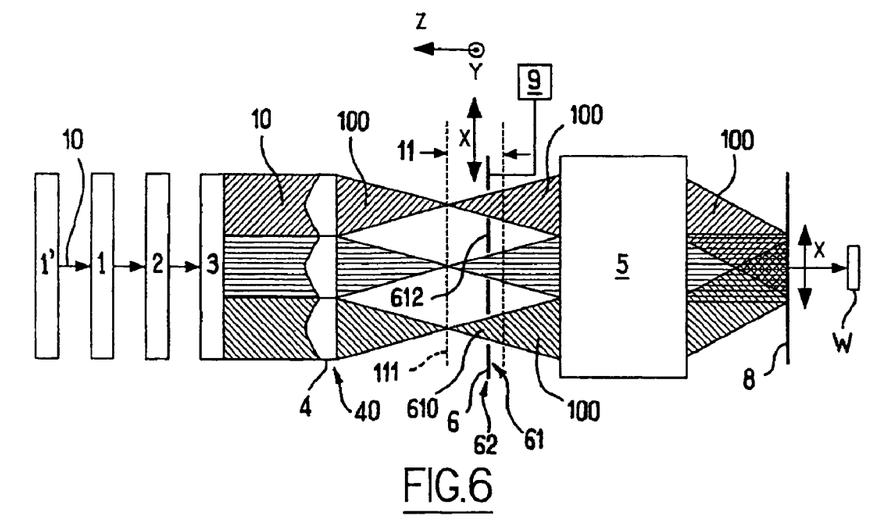
FIG. 6 diagrammatically shows a first position of the shutter in an illuminator according to the invention.

FIGS. 4A and 6 diagrammatically show that a shutter 6 of an illuminator according to the invention of a photolithography device comprises primarily at least one shutter plate 61.

Preferably, the shutter plate 61 has a square or rectangular shape. The plate 61 is composed of an opaque portion 612 capable of blocking a photolithography light beam 10. The plate 61 also comprises a plurality of slots 610 formed in the plate, capable of allowing said light beam to pass through.

FIG. 6 also shows that an illuminator of a photolithography device according to the invention comprises a source 1' of the light beam 10 for the illumination of a mask 8 for an exposure of a zone of a wafer W, and at least one main microlens array 4. It is noted that the illuminator also comprises a condenser 5 that makes it possible to superimpose the sub-beams 100 from the array 4 at the level of the mask 8 (the beam 10 is, at the output of the array 4, comprised of sub-beams 100 and thus forms an output pupil 40 of the array 4).

Preferably, the array 4 is constituted by two matrices formed by a two-dimensional array of spherical or cylindrical microlenses. The array 4 cuts the input pupil of the array 4 obtained at the output of an assembly formed by a diffractive element 1 placed at the output of the source 1', a zoom 2 and axicons 3. The diffractive element 1, the zoom 2 and the axicons 3 are placed upstream of the array 4 and at the output of the source 1'.

FIG. 6 shows that the shutter plate 61 is located in a zone 11 upstream or downstream, according to a direction Z of propagation of the light beam 10 in the illuminator, of a focusing plane 11 of the beam 10—and therefore of the sub-beams 100. The focusing of the sub-beams 100 is performed by the array 4 formed by microlenses. The shutter plate 61 of the shutter 6 is thus located in the zone 11 near the pupil 40 of the main microlens array 4.

Preferably, the plate 61 is placed on the less bulky side, namely between the focusing plane 111 and the condenser 5.

The depth of the zone 11 in direction Z is dependent on the spatial bulk of the plate with respect to the space between the array 4 and the condenser 5, but also on the width of the slots.

It can easily be seen in FIG. 6 that the width of each of the slots 610 must be such that it allows a sub-beam 100 to pass entirely in a first exposure position. The slots 610 each allow a sub-beam 100 to pass, so that the entire beam 10 passes through the plate 61 in order to illuminate the mask 8 in the first position of FIG. 6. Each sub-beam 100 has the characteristics of the beam 10, which causes all of the sub-beams 100 to have the same characteristics as one another. Their recombination at the level of the mask 8 in a focusing plane of the condenser 6 makes it possible to obtain the same result as for the illuminators comprising a group forming an optical relay.

Figure 7:
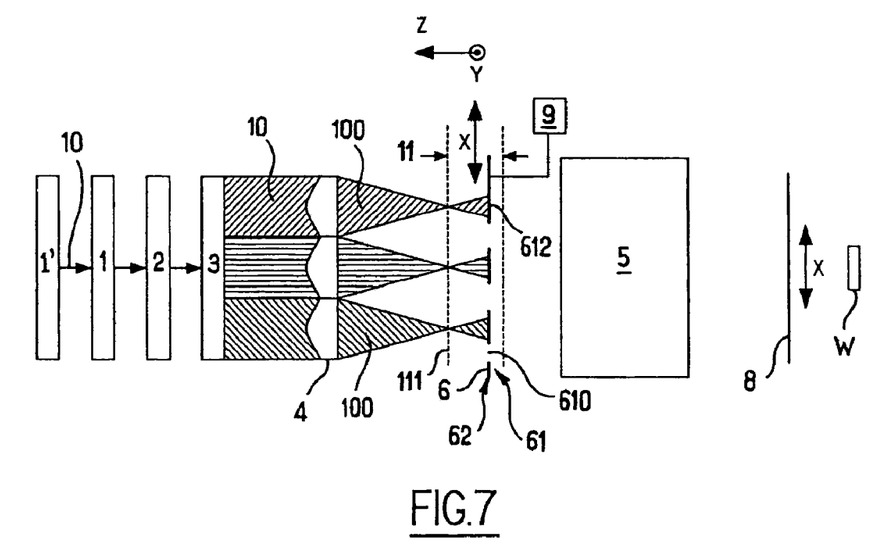
FIG. 7 diagrammatically shows a second position of the shutter in an illuminator according to the invention.

FIG. 7 shows that the plate 61 is capable of being moved with respect to the beam 10 in a direction X of movement perpendicular to direction Z and parallel to the plate 61 so as to totally block the beam 10 in a second shutter position. In the position of FIG. 7, the mask 8 is no longer illuminated. The sub-beams 100 are blocked by the opaque portion 612 of the plate 61 between the slots 610. The plate 61 makes it possible to block each sub-beam 100 just after the array 4.

Means 9 for moving the shutter 6 are capable of moving the plate 61 in synchrony with the movements of the mask 8 and the wafer W, namely in the same direction, and according to a speed proportional to the movements of the wafer W and the mask 8, while preventing exposure of the zones that should not be exposed.

The plate 61 blocks the beam at least partially between the two positions of FIG. 6 and FIG. 7.

The plate 61 is moved between the exposure position of FIG. 6 and the shutter position of FIG. 7 in synchrony with the movements of the mask 8 and the wafer W to be exposed. This mode of exposure/blocking of each beam 100 gives the same result as in the prior art shown in FIGS. 3A to 3E. Each point of the exposure zone of the wafer has the same exposure energy as all of the other points of the exposure zone in the movement of the mask 8, and in particular the zones of the wafer located outside of the zones to be exposed are not exposed to the beam 10.

FIG. 4A shows that the slots 610 of the plate 61 have an oblong shape and a longitudinal axis 611.

Preferably, each slot 610 has a substantially rectangular shape. The rectangles of the slots 610 are defined and contained between large sides 613 and small sides 614.

Also preferably, the longitudinal axes 611 of the slots 610 are parallel to one another.

The character "a" defines the distance between two longitudinal axes 611 of two successive slots of the plate 61 in the direction of movement X. "a" thus defines the pitch of the slots 610. It is constant and is dependent on the microlenses of the main array 4.

The character "b" defines the distance between two large sides 613 of two successive slots, with the understanding that said two large sides are the closest and are successive in the direction of movement X. "b" can vary in order to adjust to the illumination conditions of the weather.

For successful operation of the device according to the invention, the ratio a/b must be lower than two for the plate 61. With this ratio value, the beam is not blocked in the first position of FIG. 6, and the blocking is complete in the second position of FIG. 7.

It is noted that, with the mobile plate 61, the illuminator according to the invention no longer needs a group forming an optical relay in order to conjugate the shutter plane and the mask. The mask 8 is placed directly in the focusing plane of the condenser 5, and the shutter 6 comprising primarily the mobile shutter plate 61 is located in the zone 11 described above.

Figure 4B:
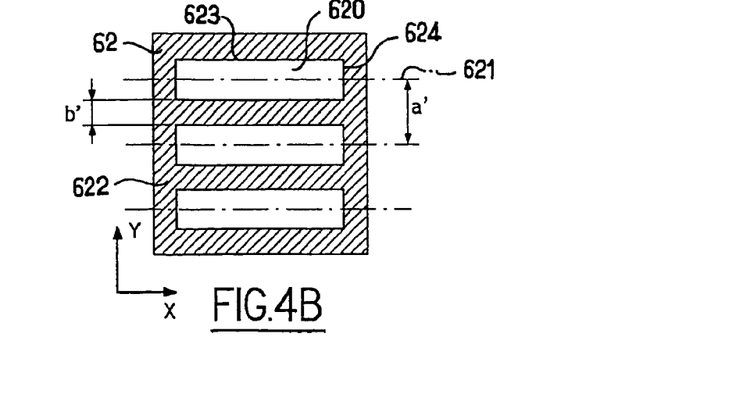

FIG. 4B shows that preferably the shutter 6 according to the invention comprises advantageously a cross-plate 62. The cross-plate 62 comprises at least one alternation of an opaque portion 622 and a slot 620 capable of allowing the light beam 10 to pass through.

The cross-plate 62 is located optically to the right of the shutter plate 61. For the sake of clarity, the cross-plate 62 has been shown near the shutter plate 61 in FIG. 5, but it can be at a distance from the shutter plate. Thus, the cross-plate 62 can be placed at the level of the main array 4, upstream or downstream according to direction Z of a microlens array. Preferably, the cross-plate 62 is located in the zone 11 near the pupil of the microlens array 4.

Other positions are possible for the cross-plate 62 according to the possibilities of mechanical implantation and bulk in the illuminator.

Preferably, each slot 620 of the cross-plate 62 has an oblong shape and a longitudinal axis 621.

Also preferably, the cross-plate 62 comprises, like the shutter plate 61, a plurality of alternations of opaque portions 622 and slots 620.

Figure 5:
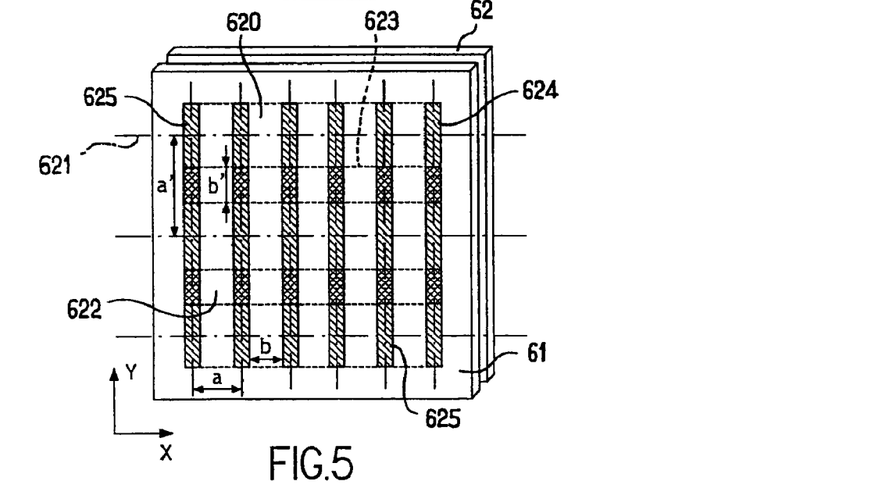
FIG. 5 diagrammatically shows a possible arrangement of the two plates of FIGS. 4A and 4B.

As shown in FIG. 5, the respective longitudinal axes 611 and 621 of the slots of the two plates 61 and 62 are perpendicular to one another.

As shown in FIGS. 4B and 5 also, each slot 620 of the cross-plate 62 has a substantially rectangular slot. Each rectangle is contained between large sides 623 and small sides 624. The longitudinal axes 621 of the slots are parallel to one another.

FIG. 5 shows that, when the cross-plate 62 is located to the right of the shutter plate 61, and the shutter plate 61 is in the first position—namely the slots of the plate 61 allow the ray 10 to pass through—the slots 610 and 620 define exposure zones 625. The shape and arrangement of the zones 625 of the shutter formed by the two plates 61 and 62 correspond to the shape and the arrangement of the various illumination zones of the microlenses of the array 4. The ratio of the small sides 614 and 624 of the respective rectangles of the plates 61 and 62 is equal to a dimensional ratio of a microlens of the array 4. In other words, the dimensions of the zones 625 are proportional to an illumination surface of a microlens of the array 4. The fact that the longitudinal axes 611 and 621 of the slots of the plates 61 and 62 are respectively perpendicular causes a plate to define a dimension of the illumination zones 625, with the other plate defining the other dimension.

As shown in FIGS. 4B and 5, a distance a' is defined between the longitudinal axes 621 of two successive slots 620 according to a direction Y perpendicular to the direction of movement X. A distance b' is also defined between two large sides 623 of said two successive slots, which two large sides 623 are close and successive according to direction Y.

The cross-plate 62 is, for the sake of simplicity, immobile with respect to the beam in a plane XY substantially parallel to the cross-plate. The cross-plate plays substantially the role of the plates 63 and 64 of a shutter according to the prior art, and the shutter plate 61 plays the role of the plates 65 and 66 of the shutter of the prior art.

By way of a non-limiting example, the plates 61 and 62 have a side of 130 mm and a thickness of several tens of millimeters. The pitch of the slots 610 and 620 is on the order of several millimeters.

The course of the plate 61 is on the order of several millimeters, with a speed of around 30 mm/s.

The plates can be made of metal or silica or fluorine coated with chromium.

We will now describe alternatives of the embodiments of the invention described above.

Figure 11:
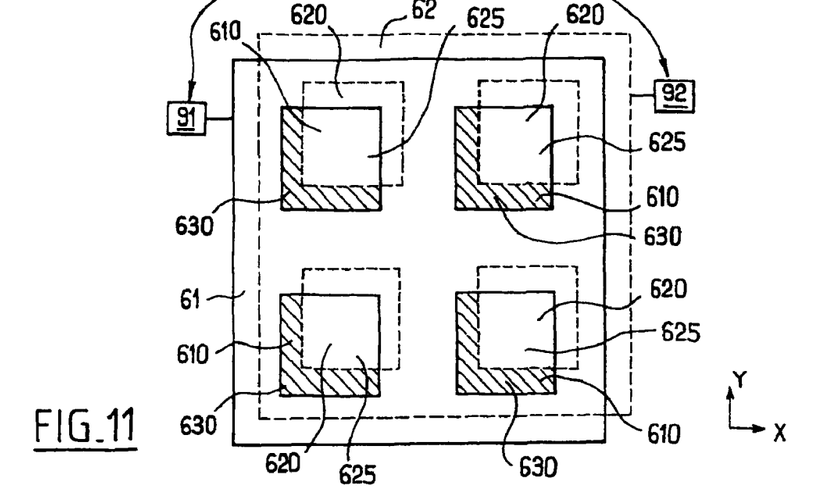
FIG. 11 diagrammatically shows an alternative of the invention comprising a mobile shutter plate and cross-plate.

FIG. 11 thus shows that, according to a first alternative, the shutter can advantageously also comprise a shutter plate 61 and a cross-plate, mobile with respect to the illumination and having slots of a different shape.

The shutter plate 61 comprises a plurality of slots 610 formed in the plate 61, and, similarly, the cross-plate 62 comprises a plurality of slots 620 formed in the plate 62.

As shown in FIG. 11, the slots 610 and 620 have substantially a square shape.

The means 9 for moving the shutter 6 comprise means 91 for moving the shutter plate 61, and means 92 for moving the cross-plate 62. Thus, the movements of the shutter plate 61 or of the cross-plate 62 can be performed in synchrony with the movements of the mask 8 and the wafer W.

The cross-plate 62 is mobile with respect to the beam in a plane (X, Y) substantially parallel to said cross-plate 62.

The shutter plate 61 is preferably also mobile in two directions (X, Y) substantially parallel to the shutter plate 61.

Thus, for an exposure of a zone of a given wafer, the position of the cross-plate 62 is adjusted with respect to the shutter plate 61, in particular in position on the Y-axis. Thus, the dimension, according to the Y-axis, of the zones 625 transparent to the illumination beam is adjusted by defining opaque zones 630 where at least one opaque zone of plate 61 and/or plate 62 is present.

As before, the ratio of the dimensions of the zones 625 transparent by the combination of slots 610 and 620 of the two plates 61 and 62 is equal to a ratio of the dimensions of a microlens of the main array 4.

The closure is then performed, as above, by moving the shutter plate 61 along the X-axis, for example, but still in synchrony with the movements of the mask 8 and the wafer W.

FIGS. 8 and 9A to 9F show another alternative according to the invention.

Figure 8:
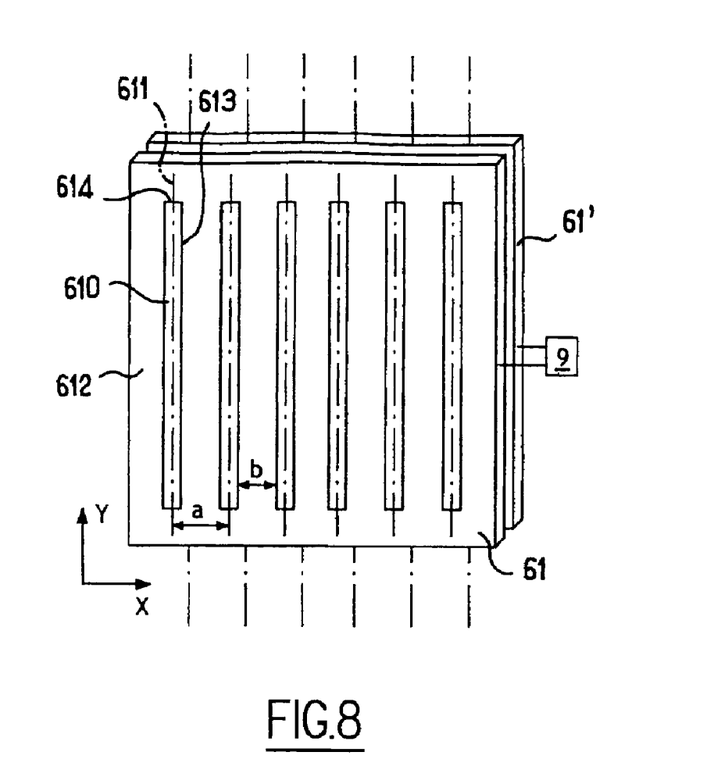
FIG. 8 diagrammatically shows an alternative of the invention comprising two shutter plates.

According to this alternative shown in FIG. 8, the illuminator comprises two shutter plates 61 and 61' optically located one opposite the other and mobile with respect to one another with respect to the beam 10 in a direction X of movement substantially parallel to the shutter plates 61 and 61'.

The movement means 9 are capable of moving the plates 61 and 61' as indicated in FIGS. 9A to 9F, in synchrony with the movements of the mask 8 and the wafer W.

In the known movement of the mask 8 and the wafer W, one with respect to the other, for an exposure for the purpose of etching, in particular the movement of the plates 61 and 61' is synchronized with the movements of the mask 8 and the wafer W.

FIGS. 9A to 9E show, for greater clarity, that the mask 8 was located on the wafer W. Of course, the mask is optically located to the right of the wafer W. Also for greater clarity, only the combination of a slot 610 and 610' respectively of each plate 61 and 61' has been shown, but the plates 61 and 61' comprise a plurality of slots.

Figure 9A:
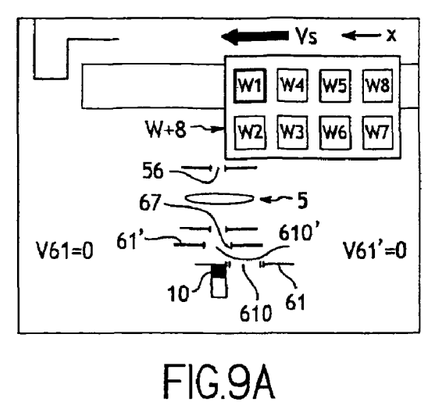

FIG. 9A shows that when the wafer W and the mask 8 move in direction X but are located outside of the exposure zone 56 defined by the condenser 6, then the slots 610 and 610' of the plates 61 and 61' are positioned one with respect to another so that the area 67 is null. The beam 10 is blocked by the shutter.

Figure 9B:
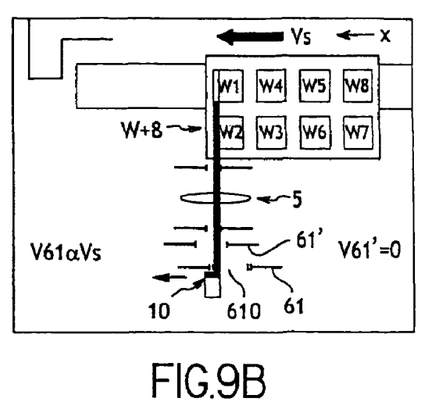

FIG. 9B shows that when the left edge of the mask 8 defining the first zone W1 of the wafer W to be exposed arrives with the speed Vs at the level of the left edge of the slot 610 of the plate 61, then the latter begins a movement in synchrony with the movements of the mask 8 and the wafer W, namely in the same direction as the mask 8 with a speed proportional to the speed Vs. The zones of the wafer W located outside of the zone W1 to be exposed are thus not exposed to the beam 10.

Figure 9C:
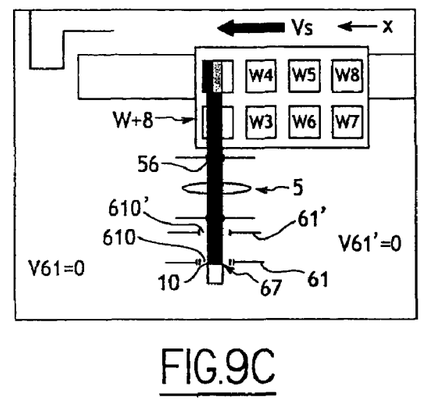

FIG. 9C shows that the plate 61 follows the mask 8 until the left edge of the mask 8 is located at the level of the left edge of the exposure zone 56. The area 67 is then maximal and the entire beam 10 exposes the zone W1 through the zone 56.

Figure 9D:
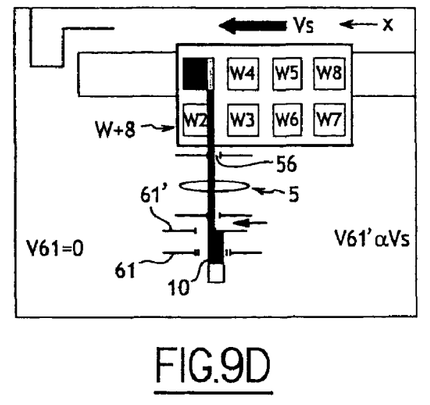

FIG. 9D shows that it is then the plate 61' that follows the mask 8 in the same direction as the mask 8 in direction X when the right edge of the mask goes beyond the right edge of the zone 56. Again, the movement of the plate 61' is in synchrony with the movements of the wafer W and the mask 8, namely in the same direction as and with a speed proportional to the speed Vs of the wafer W. In this way, the zones of the wafer W located outside of the zone W1 are not exposed to the beam 10.

Figure 9E:
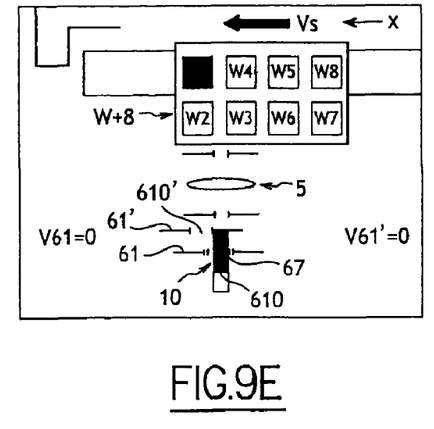

FIG. 9E corresponds to the closure of the exposure area 67, in which the right edge of the slot 610' of the plate 61' and the left edge of the slot 610 of the plate 61 are joined. The zone W1 is outside of the zone 56 and the beam 10 is blocked by the shutter.

When the mask moves in the other direction according to X, for example, for an exposure of zones W2 to W8, the plates 61 and 61' of course move in the other direction.

With this method of opening and closing the plates 61 and 61', all of the points of the zone to be etched receive the same exposure energy and the zones that should not be exposed are not exposed.

According to an alternative of the invention, the cross-plate 62 of the embodiment shown in FIG. 11 acts as the plate 61'.

Figure 10:
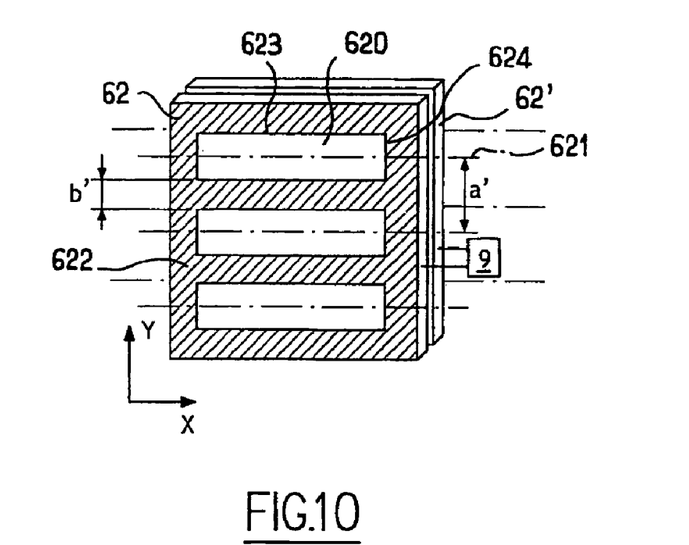
FIG. 10 diagrammatically shows an alternative of the invention comprising two cross-plates.

According to another alternative shown in FIG. 10, the illuminator comprises two cross-plates 62 and 62' located optically one opposite the other and mobile, one with respect to the other, with respect to the beam 10 in a direction Y of movement substantially parallel to the cross-plates 62 and 62'. The direction of movement of the cross-plates 62 and 62' is perpendicular to the direction X of movement of at least one shutter plate 61 placed to the right of plates 62 and 62'.

The movement means 9 are capable of moving the plates 62 and 62'. This makes it possible in particular to adjust the dimension of the exposure area according to direction Y.

Figure 12:
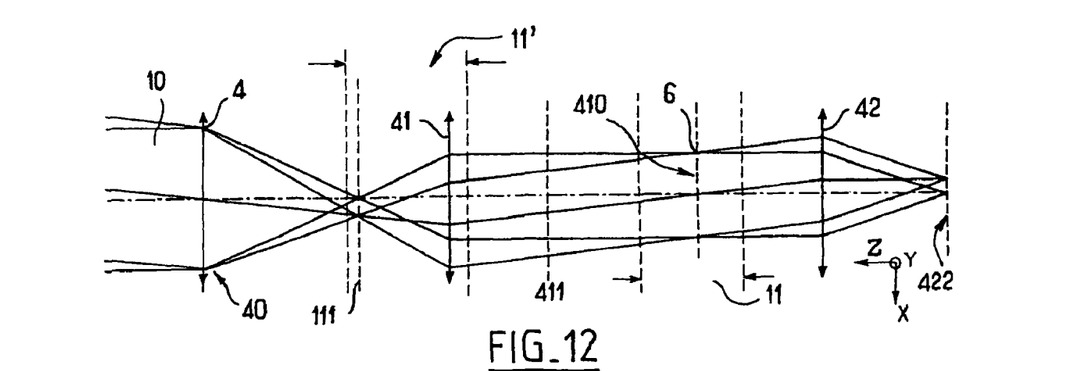
FIGS. 12 and 13 diagrammatically show an alternative of the invention comprising an array for creating a pupil image of the main pupil array.
Figure 13:
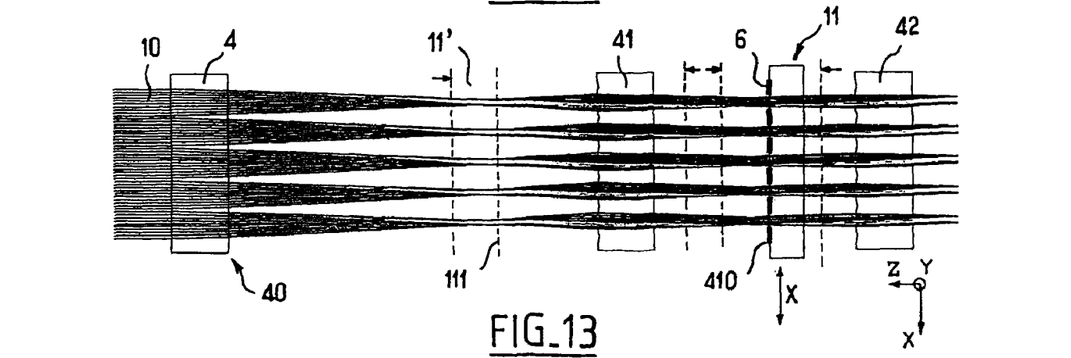

FIGS. 12 and 13 diagrammatically show another alternative according to which the illuminator has at least one array 41 of microlenses for creating a pupil 410.

Reference 111 corresponds to the focusing plane of the main array 4.

The creation array 41 is located in a zone 11' near the plane 111 for focusing the beam 10 through the main microlens array 4. The creation array 41 is located downstream of the main microlens array 4, but upstream of the shutter 6.

The array 41 makes it possible to re-image the pupil 40 of the main array 4. The beam 10 is not perfectly collimated, which can present problems of clean cutting of the illumination at the level of the mask 8.

The shutter 6 is therefore placed in a zone 11 near the pupil 410 of the optical system comprising the main array 4 and the creation array 41, which enables clean cutting of the beam and clean blocking at the level of the mask 8.

Thus, according to the invention, the shutter is placed in a zone 11 near an optical system pupil comprising only the main array when the main array is not associated with another microlens array, or near an output pupil of the optical system comprising the main array and the creation array located downstream of the main array in order to re-image the pupil of the main array.

The shutter 6 is of course placed, as in all of the embodiments described above, in a plane conjugated with the plane of the mask 8 and the plane of the wafer W.

Preferably, the illuminator comprises a microlens homogenization array 42 located downstream of the shutter 6 and upstream of a condenser 5. The array 42 also makes it possible to make the illuminator telecentric. Reference 422 corresponds to the object plane of the condenser.

The shutter is placed in a zone near an intermediate pupil 410 of the optical system comprised of the main array 4, the creation array 41 and the homogenization array 42. It can also be located in an area near an output pupil of an optical system comprising the main array, the creation array and the homogenization array.

In addition, very advantageously, the illumination profile of the mask must be trapezoidal according to the direction of movement of the mask and the wafer.

Figure 14:
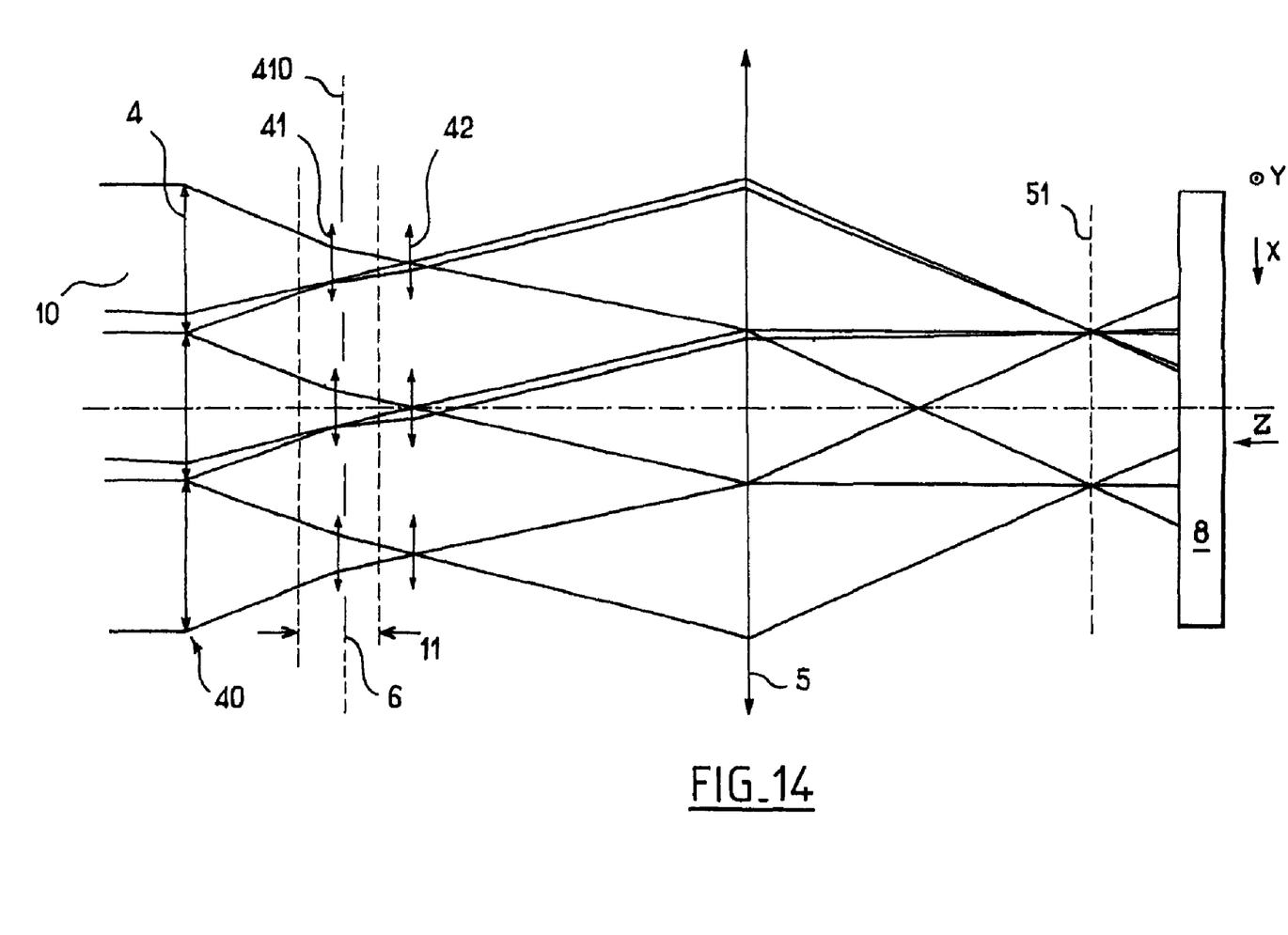
FIG. 14 diagrammatically shows an alternative of the invention comprising a mask defocused with respect to a condenser focusing plane.

To obtain the desired trapezoidal illumination profile, the mask 8 is defocused with respect to a focusing plane 51 of the condenser 5 in direction Z, perpendicular to the plane of the shutter and the direction X of movement of the mask 8, as shown in FIG. 14. Such a defocusing makes it possible in particular to correct certain illumination defects due to the nature of the illumination source, in particular when the source is a laser.

Such a defocusing can however present problems of clean cutting of the illumination at the level of the mask.

Thus, advantageously, a pitch of the slots 610 of the shutter plate 61 and the shutter 6 is greater than a pitch of the main microlens array 4 in a direction substantially parallel to a direction of movement of the mask 8. Such a difference in pitch creates a slight phase shift in the time that each opaque portion cuts the beam from the corresponding array 4.

If the illuminator comprises an array 41 of microlenses for creating a pupil 410 and/or a homogenization array 42, in order not to lose the benefit of the clean cutting provided by the advantageous presence of the creation array 41, a pitch of the slots 610 of the shutter plate 61 and the shutter 6 is greater than a pitch of the creation array 41 in a direction substantially parallel to a direction of movement of the mask 8, and preferably greater than a pitch of the array 42 in the same direction.

The alternatives described above can be combined with one another. The shutter can thus comprise two shutter plates and two cross-plates, possibly comprise an array 41 for creating a pupil 410, and possibly comprise a mask defocused in the plane 51.

In all of the embodiments mentioned above, each cross-plate 62 is preferably located in a zone 11 near a pupil of a system comprising the main microlens array 4, optically opposite the shutter plate 61.

We have described slots formed in the plates, but any number of portions transparent to the beam obviously have the same function, on the condition that the transparent portions are totally transparent to the beam and the opaque portions completely block the beam.

In every case, the movement of the shutter is performed with a precision on the order of the micron, and the fact that the shutter is comprised of plates facilitates such a precise movement.

The invention claimed is:

1. Illuminator of a photolithography device, comprising:
a source of a light beam for illuminating a mask and for exposing a zone of a wafer,
at least one main microlens array for focusing the light beam in a focusing plane, and
a shutter comprising at least one shutter plate, which plate comprises:
at least one portion opaque to the light beam, and
a plurality of portions transparent to the beam,
wherein the plate is capable of being moved with respect to the beam in a direction of movement substantially parallel to the plate, so that
the opaque portion can at least partially block the light beam, or so that
the transparent portions can allow said light beam at least partially to pass through,
movement means capable of moving the shutter in synchrony with the movements of the mask and the wafer,
wherein said illuminator further comprises
at least one array of microlenses for creating a pupil image of a pupil of the main array, wherein the creation array is located downstream of said main microlens array but upstream of the shutter, the creation array being also located in a zone near the focusing plane of the main microlens array,
wherein the shutter is located in a zone near said pupil image, in a plane conjugated with the plane of the mask and the plane of the wafer.

2. Illuminator according to claim 1, wherein each transparent portion has an oblong shape and a longitudinal axis.

3. Illuminator according to claim 2, wherein each transparent portion has a substantially rectangular shape, wherein each rectangle is contained between large sides and small sides, and the longitudinal axes of the transparent portions are parallel to one another.

4. Illuminator according to claim 3, wherein a value of a ratio between the distance between two longitudinal axes of two successive transparent portions in the direction of movement and the distance between two large sides of said two successive transparent portions, with said two large sides being close and successive in the direction of movement, is less than two.

5. Illuminator according to claim 2, wherein the shutter also comprises at least one cross-plate optically located opposite the shutter plate, wherein the cross-plate comprises at least one alternation of a portion opaque to the light beam and a transparent portion capable of allowing it to pass through.

6. Illuminator according to claim 5, wherein the transparent portion of the cross-plate has an oblong shape and a longitudinal axis.

7. Illuminator according to claim 6, wherein the cross-plate comprises a plurality of alternations.

8. Illuminator according to claim 7, wherein the respective longitudinal axes of the transparent portions of the cross-plate and the shutter plate are perpendicular to one another.

9. Illuminator according to claim 5, wherein each transparent portion of the cross-plate has a substantially rectangular shape, each rectangle is contained between large sides and small sides, and the longitudinal axes of the transparent portions are parallel to one another.

10. Illuminator according to claim 9, wherein a ratio of the small sides of the rectangles forming the transparent portions of the cross-plate and the shutter plate or a combination of the transparent portions of the two plates is equal to a ratio of the dimensions of a microlens of the array.

11. Illuminator according to claim 5, wherein the cross-plate is immobile with respect to the beam in a plane substantially parallel to said cross-plate.

12. Illuminator according to claim 5, wherein the shutter movement means comprise means for moving the shutter plate and means for moving the cross-plate, wherein the movements of the shutter plate can be made in synchrony with the movements of the mask and the wafer, and the cross-plate is mobile with respect to the beam in a plane substantially parallel to said cross-plate.

13. Illuminator according to claim 12, wherein the shutter plate is mobile in two directions substantially parallel to the shutter plate.

14. Illuminator according to claim 5, wherein the cross-plate is located in a zone near a pupil of the main array comprising at least the main microlens array, optically opposite the shutter plate.

15. Illuminator according to claim 5, comprising two shutter plates optically located opposite one another and mobile, one with respect to the other, with respect to the beam in a direction of movement substantially parallel to the cross-plates, with the direction of movement of the cross-plates being perpendicular to the direction of movement of at least one shutter plate.

16. Illuminator according to claim 1, comprising two shutter plates optically located opposite one another and mobile, one with respect to the other, with respect to the beam in a direction of movement substantially parallel to the shutter plates.

17. Illuminator according to claim 1, comprising an array of homogenization microlenses located downstream of the shutter and upstream of a condenser.

18. Photolithography device comprising an illuminator and a mask, wherein the illuminator is made according to claim 1 and comprises in addition a condenser located upstream of the mask.

19. Device according to claim 18, wherein the mask is defocused in a focusing plane of the condenser in a direction perpendicular to a direction of movement of the mask.

20. Device according to claim 19, wherein a pitch of the transparent portions of the shutter plate is greater than a pitch of the main microlens array in a direction substantially parallel to a direction of movement of the mask.

21. Device according to claim 20, wherein the illuminator comprises at least one array of microlenses for creating a pupil image of the pupil of the main array, wherein the creation array is located downstream of said main microlens array but upstream of the shutter, and a pitch of the transparent portions of the shutter plate is greater than a pitch of the creation array in a direction substantially parallel to a direction of movement of the mask.

22. Device according to claim 20, in which the illuminator comprises at least one array of homogenization microlenses, wherein the creation array is located downstream of the main microlens array but upstream of the condenser, and a pitch of the transparent portions of the shutter plate is greater than a pitch of the homogenization array in a direction substantially parallel to a direction of movement of the mask.

* * * * *